United States Patent
Guo et al.

(10) Patent No.: US 12,557,621 B2
(45) Date of Patent: Feb. 17, 2026

(54) THREE-DIMENSIONAL MEMORY AND ITS FABRICATION METHOD

(71) Applicant: YANGTZE MEMORY TECHNOLOGIES CO., LTD., Wuhan (CN)

(72) Inventors: Zhen Guo, Wuhan (CN); Bin Yuan, Wuhan (CN); Zongke Xu, Wuhan (CN); Jiajia Wu, Wuhan (CN); Beibei Li, Wuhan (CN); Xiangning Wang, Wuhan (CN); Zhu Yang, Wuhan (CN); Qiangwei Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 478 days.

(21) Appl. No.: 18/089,463

(22) Filed: Dec. 27, 2022

(65) Prior Publication Data
US 2023/0148055 A1    May 11, 2023

Related U.S. Application Data

(63) Continuation of application No. PCT/CN2021/129475, filed on Nov. 9, 2021.

(51) Int. Cl.
*H01L 21/768* (2006.01)
*H01L 23/532* (2006.01)
(Continued)

(52) U.S. Cl.
CPC .. *H01L 21/76895* (2013.01); *H01L 21/76805* (2013.01); *H01L 23/53257* (2013.01);
(Continued)

(58) Field of Classification Search
CPC ......... H01L 21/76805; H01L 21/76895; H01L 23/53257; H01L 23/535; H10B 41/50; H10B 43/50
See application file for complete search history.

(56) References Cited

U.S. PATENT DOCUMENTS

| | | | |
|---|---|---|---|
| 9,419,013 B1 * | 8/2016 | Lee | H10B 43/35 |
| 2010/0013049 A1 * | 1/2010 | Tanaka | H10B 43/20 |
| | | | 257/532 |

(Continued)

FOREIGN PATENT DOCUMENTS

| | | |
|---|---|---|
| CN | 112909005 A | 6/2021 |
| CN | 113013174 A | 6/2021 |

*Primary Examiner* — Andres Munoz
(74) *Attorney, Agent, or Firm* — BAYES PLLC

(57) ABSTRACT

A method of fabricating a three-dimensional memory includes forming a laminated structure including stacked dummy gate layers and interlayer insulation layers on one side of a substrate. The respective adjacent dummy gate layers and interlayer insulation layers form staircase stairs. At least a part of the interlayer insulation layer of each of the staircase stairs is exposed. The method also includes forming a buffer layer covering the staircase stairs. The method further includes removing a part of the buffer layer covering the sidewalls of the staircase stairs to form spacing grooves. The method further includes forming a dielectric layer that fills the spacing grooves and covers the staircase stairs. The method further includes forming a contact hole penetrating through the dielectric layer and the buffer layer and extending to the dummy gate layer farthest from the substrate.

18 Claims, 4 Drawing Sheets

(51) Int. Cl.
*H01L 23/535* (2006.01)
*H10B 43/50* (2023.01)
*H10B 41/50* (2023.01)

(52) U.S. Cl.
CPC .......... *H01L 23/535* (2013.01); *H10B 43/50* (2023.02); *H10B 41/50* (2023.02)

(56) References Cited

U.S. PATENT DOCUMENTS

| | | | |
|---|---|---|---|
| 2015/0179564 A1* | 6/2015 | Lee | H10B 43/50 257/773 |
| 2015/0255385 A1* | 9/2015 | Lee | H10B 43/50 257/775 |
| 2015/0270165 A1* | 9/2015 | Hyun | H10B 43/35 257/329 |
| 2016/0218107 A1* | 7/2016 | Lee | H10B 41/50 |
| 2017/0117222 A1* | 4/2017 | Kim | H01L 23/5283 |
| 2019/0013237 A1* | 1/2019 | Nam | H10B 43/50 |
| 2019/0035733 A1* | 1/2019 | Park | H01L 23/535 |
| 2019/0096810 A1* | 3/2019 | Zhu | H01L 23/535 |
| 2020/0035553 A1* | 1/2020 | Yatsuda | C23C 18/52 |
| 2022/0051983 A1* | 2/2022 | Kim | H10B 43/40 |

\* cited by examiner

THREE-DIMENSIONAL MEMORY AND ITS FABRICATION METHOD

CROSS-REFERENCE TO RELATED APPLICATIONS

This application is a continuation of International Application No. PCT/CN2021/129475, filed on Nov. 9, 2021, which is incorporated herein by reference in its entirety.

TECHNICAL FIELD

The present disclosure relates to the field of semiconductor technology, more specifically, to a three-dimensional memory and a fabrication method thereof.

BACKGROUND

Generally speaking, the three-dimensional memory includes a laminated structure formed by alternately stacking gate layers and the interlayer insulation layers, wherein an electrical connection between an external circuit and a gate is realized through a contact structure located in a staircase region of the laminated structure. In an actual fabrication course of a three-dimensional memory, in order to realize an electrical connection between a contact structure and a gate layer in the laminated structure, it is necessary to conduct to etch in a dielectric layer covering the laminated structure to form a contact hole exposing the top surfaces of respective gate layers of the staircase region, and then fill the contact hole with a conductive material to form a contact structure.

However, with the improvement of three-dimensional memory integration degree and the increase of the number of stacked layers, the depth of the contact hole is deepened increasingly, so it is easy to cause gate layer breakdown in the course of forming the contact hole. In this case, after the contact hole is filled with conductive material used to form the contact structure, a short circuit between different gate layers may be caused (i.e., word line bridging between different layers), thus inducing the failure of the memory.

At present, in order to prevent gate layer breakdown in the course of forming the contact hole, it is often to increase the thickness of a region for forming the contact hole in the gate layer. However, in the actual manufacturing process, increasing the thickness of a part of region in the gate layer will reduce the uniformity of the material in this region, which is easy to cause gaps in this region. In addition, due to the limitations of the actual manufacturing process, the process of increasing the thickness of a part of region in the gate layer will reduce the thickness of other adjacent regions, which will easily lead to an increase in the resistance values of adjacent regions, and thus reduce the conductive performance of the three-dimensional memory.

SUMMARY

The present disclosure provides a fabrication method of a three-dimensional memory, and the fabrication method of the three-dimensional memory includes: forming a laminated structure including stacked dummy gate layers and interlayer insulation layers on one side of a substrate, the respective adjacent dummy gate layers and interlayer insulation layers forming a plurality of staircase stairs, wherein at least a part of the interlayer insulation layer of each of the staircase stairs is exposed; forming a buffer layer covering the staircase stairs; removing a part of the buffer layer covering the sidewalls of the staircase stairs to form a plurality of spacing grooves; forming a dielectric layer that fills the spacing grooves and covers the staircase stairs; and forming a contact hole penetrating through the dielectric layer and the buffer layer and extending to the dummy gate layer farthest from the substrate.

In one implementation, when removing a part of the buffer layer covering the sidewalls of the staircase stairs, the fabrication method further includes: removing at least a part of the interlayer insulation layer below the part of the buffer layer covering the sidewalls of the staircase stairs.

In one implementation, after the step of forming a dielectric layer that fills the spacing grooves and covers the staircase stairs, and before the step of forming a contact hole penetrating through the dielectric layer and the buffer layer and extending to the dummy gate layer farthest from the substrate, the fabrication method further includes: replacing the dummy gate layer with a gate layer; and replacing the buffer layer with a conductor layer, wherein the materials of the gate layer and the conductor layer are the same.

In one implementation, the step of forming the laminated structure on a substrate includes: alternately stacking the interlayer insulating layers and the dummy gate layers on the substrate to form the laminated structure; and forming the interlayer insulation layers and the dummy gate layers as having a staircase form with the plurality of staircase stairs by etching the laminated structure, and exposing at least a part of the interlayer insulation layer of each of the staircase stairs.

In one implementation, the material of the buffer layer is TS SIN, and the material of the dummy gate layer is SIN.

In one implementation, the fabrication method further includes: filling a conductive material in the contact hole to form a contact structure.

In one implementation, the fabrication method further includes: forming a dummy channel hole penetrating through the dielectric layer and the laminated structure and extending to the substrate, and filling an insulating material in the dummy channel hole to form a dummy channel structure.

In one implementation, the materials of the gate layer and the conductor layer both include tungsten.

In one implementation, the fabrication method further includes: performing a planarization treatment on the surface of the dielectric layer.

Another aspect of the present disclosure provides a three-dimensional memory. The three-dimensional memory includes a laminated structure including stacked gate layers and interlayer insulation layers. A pair of adjacent one of the gate layers and one of the interlayer insulation layers forms a staircase stair. At least a part of the interlayer insulation layer of the staircase stair is exposed. The three-dimensional memory also includes a conductor layer on the exposed part of the interlayer insulation layer and separated from the gate layer of the staircase stair through an insulating material. The three-dimensional memory further includes a contact structure penetrating through the conductor layer and extending to the gate layer.

In one implementation, the three-dimensional memory further includes a dielectric layer covering the conductor layer, and the contact structure penetrates through the dielectric layer and the conductor layer and extends to the gate layer.

In one implementation, the interlayer insulating layer and the dielectric layer are both insulating materials.

In one implementation, the three-dimensional memory further includes a dummy channel structure penetrating through the dielectric layer and the laminated structure.

In one implementation, the materials of the gate layer and the conductor layer both include tungsten.

In one implementation, the insulating material that separates the conductor layer and the gate layer is part of the dielectric layer.

In one implementation, the gate layer to which the contact structure extends is one of the gate layers that is closest to the conductor layer.

In one implementation, the contact structure penetrates through a part of the gate layer.

BRIEF DESCRIPTION OF THE DRAWINGS

Other features, objects, and advantages of the present disclosure will become more apparent by reading the detailed description of the non-limiting implementations made with reference to the following accompanying drawings, wherein.

DETAILED DESCRIPTION

Figure 1:
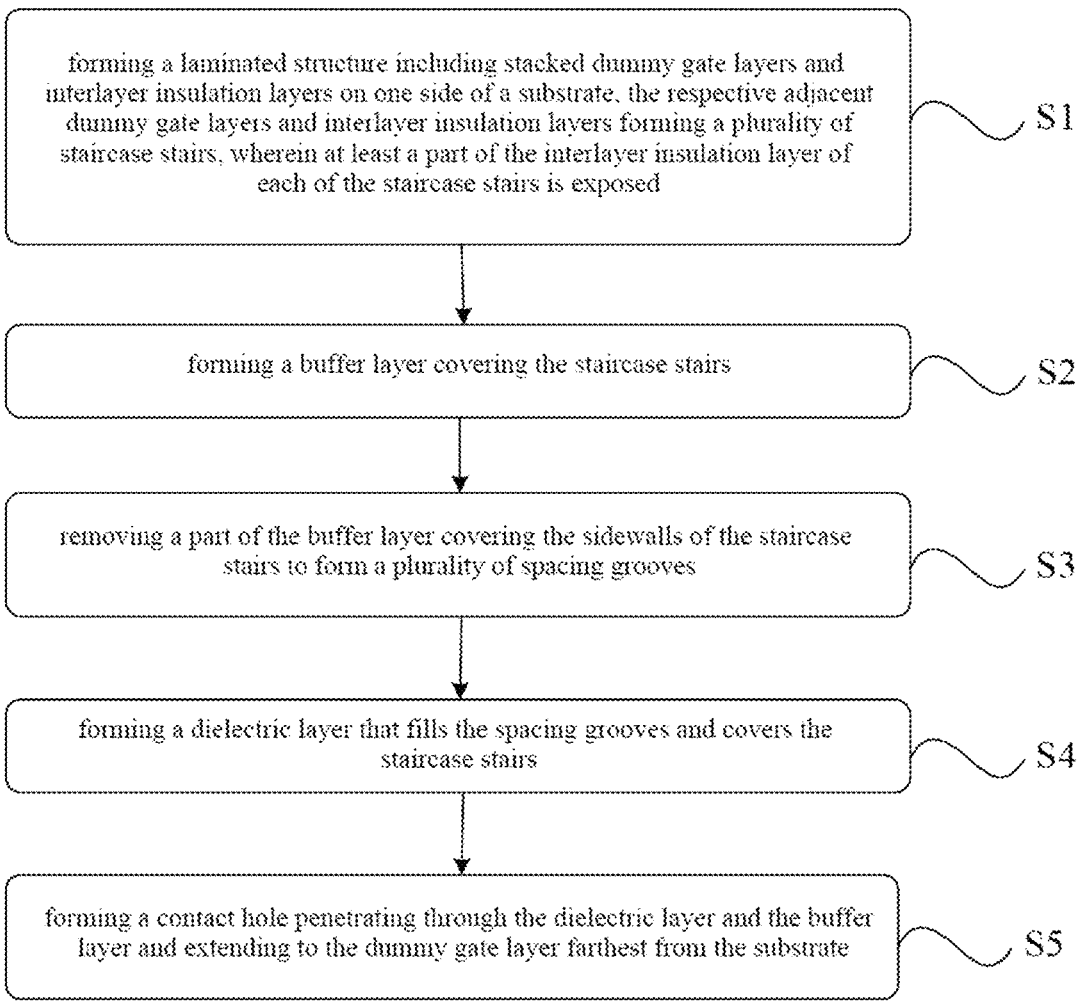
FIG. 1 is a flowchart of a fabrication method of a three-dimensional memory according to an exemplary implementation of the present disclosure.

In order to better understand the present disclosure, respective aspects of the present disclosure will be described in more detail with reference to the accompanying drawings. It should be understood that these detailed descriptions are only a description of exemplary implementations of the present disclosure, but do not limit the scope of the present disclosure in any way.

It should be noted that in this specification, the expressions of "first," "second," "third," etc. are only used to distinguish one feature from another one, but do not indicate any limitation to the features, especially not indicate any successively sequence. Therefore, without departing from the teaching of this application, "first" discussed in the present disclosure can also be referred to as "second" and vice versa.

In the accompanying drawings, the thickness, size, and shape of the component have been slightly adjusted for ease of illustration. The accompanying drawings are examples only and are not drawn strictly to scale. As used herein, the terms "approximately," "about," and similar terms are used as terms to express approximation rather than degree, and are intended to explain the inherent deviation in a measured or calculated value that will be recognized by those skilled in the art.

The terms used herein are for the purpose of describing specific exemplary implementations and are not intended to be restrictive. When used in this specification, the terms "include," "included," "comprise," and/or "comprised" indicate the existence of the feature, whole, element, component and/or combination thereof, but do not exclude the existence of one or more other features, wholes, elements, components and/or combinations thereof.

The description will be made herein with reference to the schematic diagrams of the exemplary implementations. The exemplary implementations disclosed herein should not be interpreted as being limited to the specific shapes and sizes shown, but include various equivalent structures capable of achieving the same function, and shape and size deviations resulting from, for example, fabrication. The positions shown in the accompanying drawings are schematic in nature and are not intended to limit the positions of the respective components.

Unless otherwise defined, all terms used herein (including technical terms and scientific terms) have the same meaning as those generally understood by those skilled in the art to which the present disclosure belongs. Terms such as those defined in common dictionaries shall be interpreted as having the same meaning as their meaning in the context of the relevant field, and will not be interpreted in an idealized or overly formalized sense, unless explicitly so defined herein.

As used herein, the term "layer" refers to a material part including a region having a height. The layer has a top side and a bottom side, wherein the bottom side of the layer is relatively close to the substrate, and the top side is relatively far away from the substrate. The layer can extend over the entire substructure or superstructure, or can have a range smaller than that of the substructure or superstructure. In addition, the layer can be a region of homogenous or inhomogeneous continuous structure, and its height is less than the height of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers.

The three-dimensional memory and its fabrication method provided according to one or more implementations of the present disclosure may have at least one of the following advantages: 1) By sequentially stacking the dummy gate layer and the interlayer insulation layer on the substrate, the interlayer insulation layer is located above the dummy gate layer in each staircase stair formed. In this way, at least a part of the interlayer insulation layer is exposed on the upper side, which is advantageous for making the buffer layer cover the surface of the interlayer insulation layer; 2) By arranging the buffer layer on the surface of the interlayer insulation layer, the direct contact between the buffer layer and the dummy gate layer can be effectively avoided; and 3) By replacing the buffer layer and the dummy gate layer with conductive materials, and forming a contact hole penetrating through the buffer layer and extending to the dummy gate layer farthest from the substrate, the probability of breakdown of the gate layer in the course of forming the contact hole can be reduced, and the thickness reduction of a part of region in the gate layer can be avoided, which is advantageous for improving the conductive performance of the three-dimensional memory.

FIG. 1 is a flowchart of a fabrication method 1000 of a three-dimensional memory according to an exemplary implementation of the present disclosure.

As shown in FIG. 1, the fabrication method 1000 of the three-dimensional memory provided by the present disclosure may include: S1, forming a laminated structure including stacked dummy gate layers and interlayer insulation layers on one side of the substrate, respective adjacent dummy gate layers and interlayer insulation layers forming a plurality of staircase stairs, wherein at least a part of the interlayer insulation layer of each staircase stair is exposed; S2, forming a buffer layer covering the staircase stairs; S3, removing the part of the buffer layer covering the sidewalls of the staircase stairs to form a plurality of spacing grooves;

S4, forming a dielectric layer that fills the spacing groove and covers the staircase stairs; and S5, forming a contact hole penetrating through the dielectric layer and the buffer layer and extending to the dummy gate layer farthest from the substrate. Steps S1 to S5 will be further described below.

Figure 2:
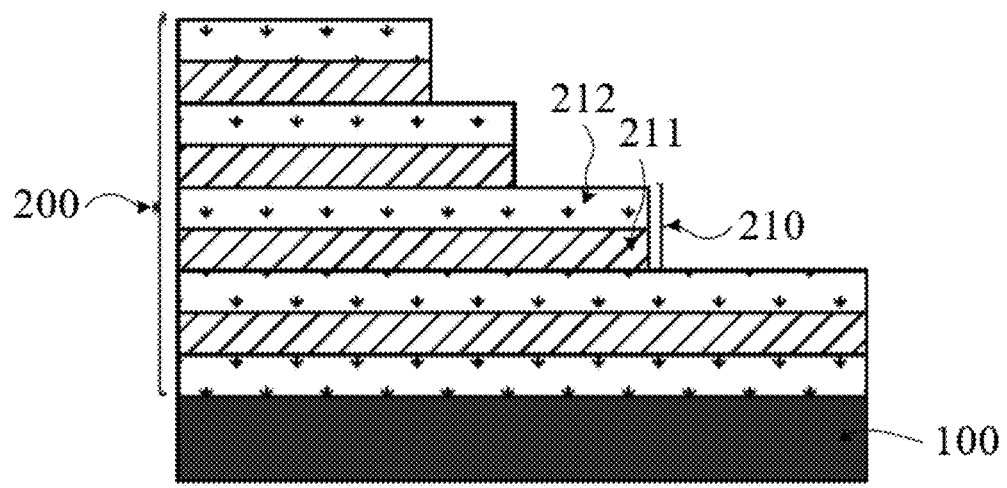
FIGS. 2 to 6 are process step diagrams of a fabrication method of a three-dimensional memory according to an exemplary implementation of the present disclosure.

Step S1: as shown in FIG. 2, a laminated structure 200 including a plurality of staircase stairs 210 is formed on one side of the substrate 100, and each staircase stair 210 is formed by an adjacent dummy gate layer 211 and an interlayer insulation layer 212. Specifically, in this step S1, the interlayer insulation layer 212 and the dummy gate layer 211 are alternately stacked on the substrate 100 to form a laminated structure 200 including the plurality of staircase stairs 210, wherein the region of the laminated structure 200 corresponding to the plurality of staircase stairs 210 is called a staircase region and used for arranging a word line connection structure. By sequentially stacking the dummy gate layer 211 and the interlayer insulation layer 212 on the substrate 100, the interlayer insulation layer 212 is located above the dummy gate layer 211 in each staircase stair 210, so that at least a part of the interlayer insulation layer 212 is exposed on the upper side.

In the exemplary implementation of the present disclosure, the substrate 100 may be, for example, a single crystal silicon (Si) substrate, a single crystal germanium (Ge) substrate, a silicon germanium (SiGe) substrate, a silicon carbide (SiC) substrate, or a silicon on insulator (SOI) substrate, a germanium on insulator (GOI) substrate, or a substrate including other element semiconductors or compound semiconductors, such as GaAs, InP or SiC. In one implementation, the substrate 100 may also be a laminated structure, such as Si/SiGe. In another implementation, the substrate 100 may also be other epitaxial structures, such as silicon germanium on insulator (SGOI).

In the exemplary implementation of the present disclosure, the laminated structure 200 may be formed on the substrate 100 by one or more deposition processes. The deposition process for forming the laminated structure 200 on the substrate 100 includes, but is not limited to, atomic layer deposition (ALD), physical vapor deposition (PVD), chemical vapor deposition (CVD), or any combination thereof. It should be understood that the number and thickness of the interlayer insulation layers 212 and the dummy gate layers 211 are not limited to those shown in FIG. 2. Without departing from the concept of the present disclosure, those skilled in the art can arrange any number and thickness of the interlayer insulation layers 212 and the dummy gate layers 211 as required. In addition, suitable materials known in the art may be selected for the materials of the interlayer insulation layer 212 and the dummy gate layer 211. For example, the interlayer insulation layer 212 and the dummy gate layer 211 may be two dielectric layers with different materials. The materials of the interlayer insulation layer 212 and the dummy gate layer 211 may have different etching selection ratios to facilitate the removal of the dummy gate layer 211 in subsequent processes. For example, the material of the dummy gate layer 211 may include nitride, and the material of the interlayer insulation layer 212 may include oxide. For example, the interlayer insulation layer 212 may be, such as silicon oxide, and the dummy gate layer 211 may be, such as silicon nitride.

As shown in FIG. 2, in addition to the staircase region, the laminated structure 200 may have a core region (not shown), wherein the core region may be used to form array memory cell strings which may be a plurality of interconnected memory cells formed in a direction perpendicular to the substrate 100. The staircase region may be used to form a contact structure on a gate layer (which may be formed by replacing the dummy gate layer 211) to draw a current therefrom.

In order to concisely and clearly explain the present disclosure, the process course is explained herein only taking the laminated structure including a single sub-laminate as an example. Those skilled in the art should understand that the laminated structure 200 can also include a plurality of sub-laminates. That is, the laminated structure 200 can be formed by a single sub-laminate or a plurality of sub-laminates stacked sequentially. It should also be noted that, for the sake of clarity, only a part of the staircase region of the laminated structure 200 is shown in the respective accompanying drawings of the present disclosure.

As shown in FIG. 2, in the exemplary implementation of the present disclosure, a plurality of staircase stairs 210 may be formed in the staircase region by performing a repeated etching-trimming process on the laminated structure 200 using a patterned mask (not shown). The patterned mask may include a photoresist or a carbon-based polymer material and may be removed after forming the staircase stairs. Referring to FIG. 2, the top surface of each staircase stair 210 formed exposes at least a part of the interlayer insulation layer 212 located in the corresponding layer. That is, each staircase stair 210 includes at least one level, and each level successively includes an interlayer insulation layer 212 and a dummy gate layer 211 from top to bottom.

In the exemplary implementation of the present disclosure, the staircase stair 210 may be formed at the center of the laminated structure 200, and may also be formed at one or more side edges of the laminated structure 200. As an example, the following description is made mainly with respect to the staircase stair formed on one or more side edges of the laminated structure. In addition, it should be noted that in order to explain the present disclosure concisely and clearly, the respective accompanying drawings herein only show the case where each staircase stair includes one level. It should also be noted that the number of staircase stairs can be adjusted as required, which depends on the number of dummy gate layers in the laminated structure and the number of layers contained in each staircase stair.

Figure 3:
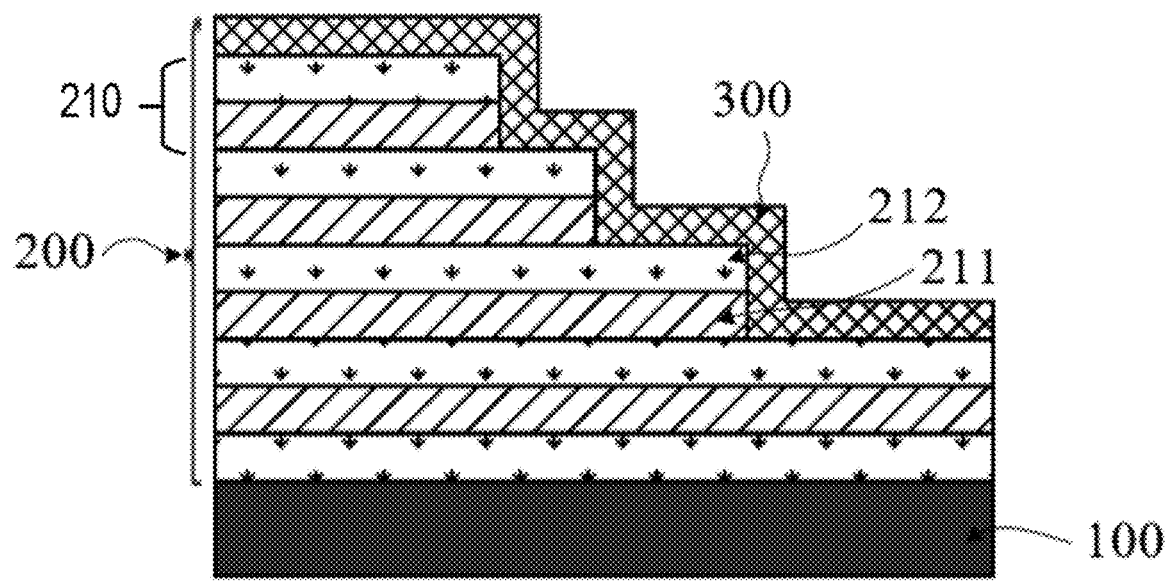

Step S2: as shown in FIG. 3, in the exemplary implementation of the present disclosure, a buffer layer 300 may be formed on the top surface and sidewall of each staircase stair 210. The buffer layer 300 can cover the exposed part of the interlayer insulation layer 212 on the top surfaces of respective staircase stairs 210, and can cover the sidewalls of respective staircase stairs 210, that is, covering the common sidewall of the dummy gate layer 211 and the interlayer insulation layer 212 exposed by each sidewall.

As an example, the buffer layer 300 may be formed on the top surface and sidewall of each staircase stair 210 by, for example, atomic layer deposition (ALD), physical vapor deposition (PVD), chemical vapor deposition (CVD), or any combination thereof. For example, the buffer layer 300 may be formed by an atomic layer deposition process. As an example, the material for forming the buffer layer 300 may be silicon nitride.

Figure 4:
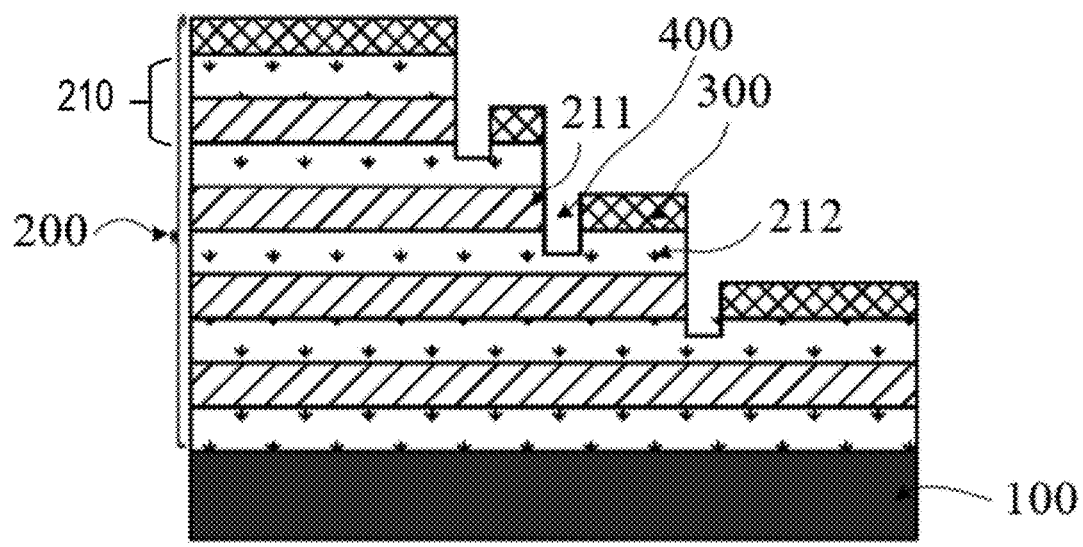

Step S3: as shown in FIG. 4, in the exemplary implementation of the present disclosure, the part of the buffer layer 300 covering the sidewalls of the staircase stairs 210 may be removed to form a plurality of spacing grooves 400, so that the buffer layer 300 is separated from the dummy gate layer 211 on the same plane. In this way, when the buffer layer 300 is subsequently replaced with the conductor layer 500 and the dummy gate layer 211 is subsequently replaced with the gate layer 600, this spacing can prevent the conductor layer 500 from contacting the gate layer 600 on the same plane, thus effectively avoiding the short circuit between different gate layers (i.e., word line bridging between different layers). In addition, replacing the buffer layer 300 with a conductor layer can also avoid breakdown of the gate layer when subsequently forming a contact hole.

As an example, the buffer layer 300 formed on the sidewalls of the staircase stairs can be removed by dry etching such as deep reactive ion etching (RIE) or wet etching using phosphoric acid as an etchant, but the present disclosure is not limited to this.

In the actual process, when removing the part of the buffer layer 300 covering the sidewalls of the staircase stairs, it is possible to remove at least a part of the interlayer insulation layer 212 below the part of the buffer layer 300 covering the sidewalls of the staircase stairs 210. However, the thickness of the dummy gate layer 211 is not reduced. By arranging the buffer layer 300 on the surface of the interlayer insulation layer 212, the present disclosure can effectively avoid damage to the thickness of the dummy gate layer 211 when removing the part of the buffer layer 300 covering the sidewalls of the staircase stairs 210, thereby avoiding reducing the conductive performance of the three-dimensional memory.

Figure 5:
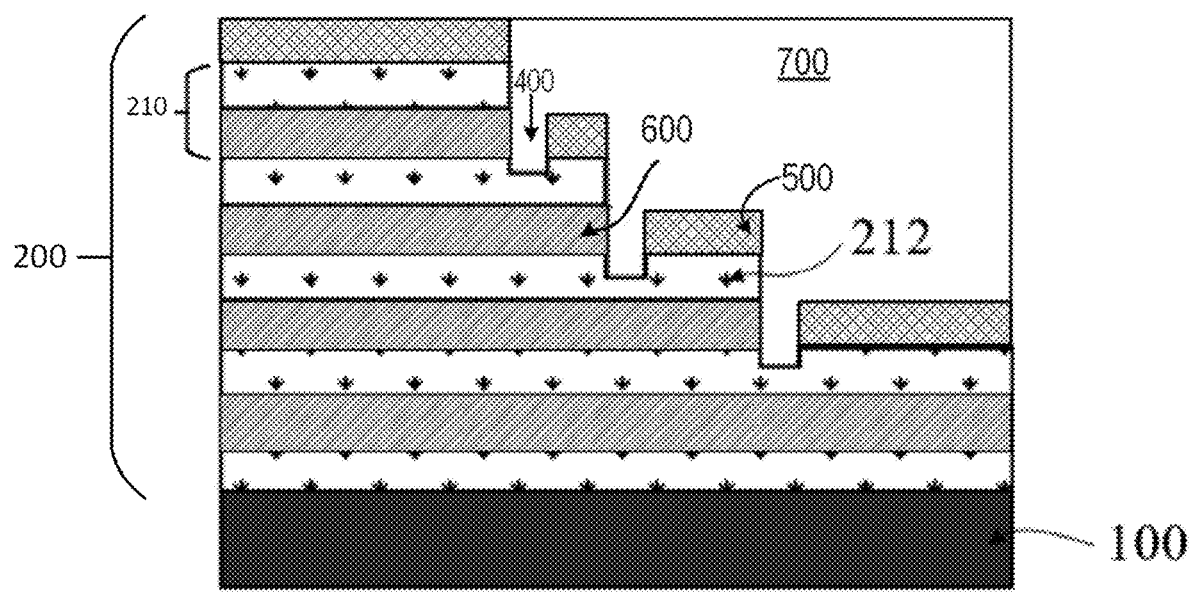

Step S4: as shown in FIG. 5, a dielectric layer 700 that fills the spacing groove 400 and covers the staircase stairs is formed. As can be seen from FIG. 5, the dielectric layer 700 is not only filled above the staircase stairs 210, but also filled in the spacing groove 400 formed by removing the buffer layer 300.

As an example, the dielectric layer 700 may be formed by depositing oxides, which may be selected from, for example, silicon oxide-based materials. In the exemplary implementation of the present disclosure, the dielectric layer 700 may be formed by filling TEOS based silicon oxide. For example, the dielectric layer 700 may be a multi-layer structure, wherein a first sub-film layer (such as silicon oxide ($SiO_2$) deposited by high-density plasma (HDP) or silicon oxide deposited by atomic layer deposition (ALD)) with good staircase stair coverage is first formed. Then, a second sub-film layer with high filling efficiency can be formed subsequently, and the second sub-film layer can be such as TEOS based $SiO_2$. In the exemplary implementation, the density of the first sub-film layer is higher than that of the second sub-film layer, so that the first sub-film layer has good staircase stair coverage and the second sub-film layer has high filling efficiency.

As an example, a process such as chemical mechanical polishing is used to perform a planarization treatment on the dielectric layer 700, so that the dielectric layer 700 provides a substantially flat upper surface for the staircase region of the laminated structure 200.

For example, the buffer layer 300 may also be replaced with the conductor layer 500, and the dummy gate layer 211 may be replaced with the gate layer 600. As an example, when replacing the conductor layer 500 and the gate layer 600, for example, the dummy gate layer 211 and the buffer layer 300 in the laminated structure 200 may be removed by an etching process (e.g., wet etching). Then conductive materials such as tungsten metal are filled.

As an example, the conductor layer 500 and the gate layer 600 may be made of a metallic tungsten material, and the dielectric layer 700 and the interlayer insulation layer 212 may be made of a $SiO_2$ material.

Step S5: a contact hole 800, which penetrates through the dielectric layer 700 and the buffer layer 300 and extends to the dummy gate layer of the plurality of dummy gate layers 211 farthest from the substrate, may be formed. Specifically, after the buffer layer 300 is replaced with the conductor layer 500 and the dummy gate layer 211 is replaced with the gate layer 600, as shown in FIG. 6, a plurality of contact holes 800 penetrating through the dielectric layer 700 and the conductor layer 500 and extending to the gate layer 600 farthest from the substrate can be formed.

In the exemplary implementation of the present disclosure, before forming a plurality of contact holes penetrating through the dielectric layer 700 and the buffer layer 300 and extending to the dummy gate layer 211 farthest from the substrate, the dummy gate layer 211 may be replaced with the gate layer 600 and the buffer layer 300 may be replaced with a conductor layer 500. The materials of the gate layer 600 and the conductor layer 500 may be the same. For example, the materials of the gate layer 600 and the conductor layer 500 may both be metallic tungsten. In the present disclosure, replacing the dummy gate layer 211 with the gate layer 600 can improve the uniformity of the gate layer 600, i.e., the generation of gaps such as bubbles in the gate layer 600 can be effectively avoided. For example, a plurality of contact holes 800 penetrating through the dielectric layer 700 and the conductor layer 500 and extending to the gate layer 600 farthest from the substrate may be formed in the lamination direction perpendicular to the laminated structure 200, and then a conductive material may be filled in the formed plurality of contact holes 800 to form a contact structure on the top surface of each gate layer 600. The process provided by the present disclosure can, on the basis of ensuring the uniformity of the gate layer 600, not only reduce the probability of breakdown of the gate layer 600, but also avoid the reduction of the thickness of a part of region in the gate layer 600.

For example, a plurality of contact holes 800 penetrating through the dielectric layer 700 and the conductor layer 500 and extending to the gate layer 600 farthest from the substrate may be formed by a wet etching process. Since the conductor layer 500 is located above the gate layer 600, the probability of the breakdown of gate layer 600 can be reduced. Then, in the removed space, a contact structure is formed by filling with a conductive material such as a tungsten alloy. It should be noted that the selection of materials for the above respective layers and the specific process for their formation and removal are only for the purpose of more clearly and concisely explaining the present disclosure, rather than limiting the present disclosure.

Figure 6:
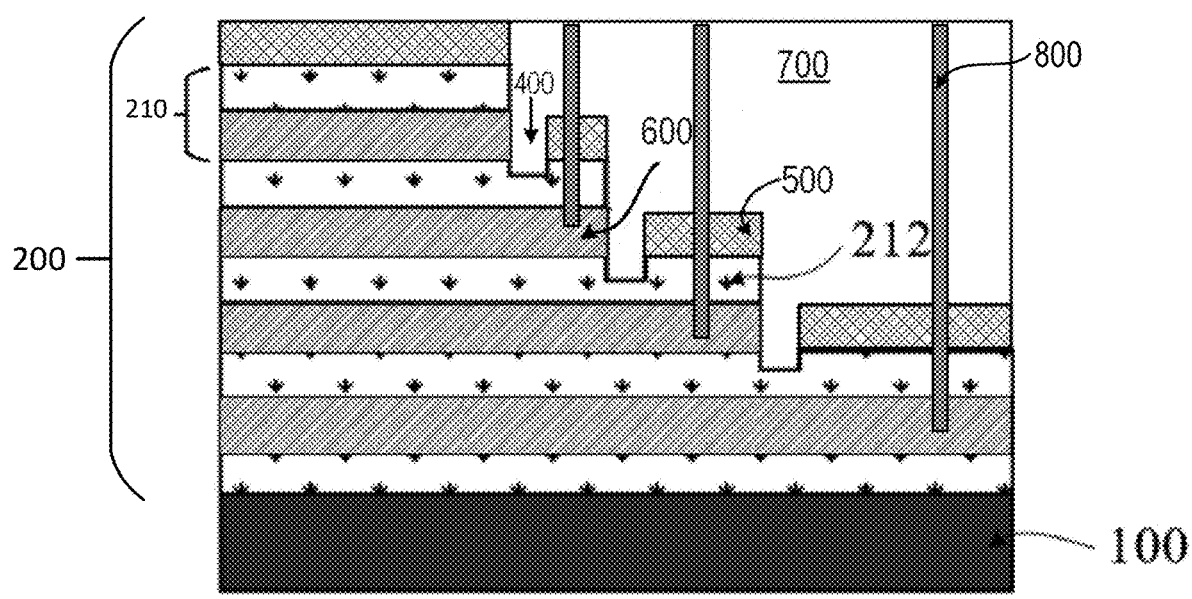

As an example, first, a plurality of contact holes 800 may be formed in the staircase region by a photolithography and etching process (FIG. 6). Then, the contact hole 800 is filled with a conductive material such as a tungsten alloy to form a contact structure. The contact structure can form an electrical connection with the subsequently formed gate, thereby leading out the gate current.

In the exemplary implementation of the present disclosure, the fabrication method of the three-dimensional memory further includes forming a dummy channel hole (not shown) penetrating through the staircase region and extending to the substrate in the staircase region, and filling the dummy channel hole with insulating material to form a dummy channel structure (not shown). As an example, a dummy channel hole penetrating through the dielectric layer and extending to the substrate 100 may be first formed in the staircase region by a photolithography and etching process. Then the dummy channel holes are filled with insulating materials, such as silicon nitride-based materials deposited by ALD, to form a dummy channel structure. As another example, the dummy channel hole may also be formed together with the contact hole 800, and then the dummy channel hole may be filled with insulating material to form a dummy channel, and the contact hole may be filled with conductive material to form a contact structure, respectively.

Another aspect of the present disclosure provides a three-dimensional memory. FIG. 6 shows a structure of a three-dimensional memory according to an exemplary implementation of the present disclosure.

As shown in FIG. 6, the three-dimensional memory may include a substrate 100, a laminated structure 200, a conductor layer 500, and a contact hole 800.

The laminated structure 200 may be disposed on one side of the substrate 100. The laminated structure 200 may have a plurality of staircase stairs, each of which includes a gate layer 600 and an interlayer insulation layer 212 stacked sequentially. The conductor layer 500 may be disposed at an exposed part of the interlayer insulation layer 212 and may be disconnected from the gate layer 600 through an insulating material. The contact hole 800 may penetrate through the conductor layer 500 and extend to the gate layer farthest from the substrate 100.

For example, the three-dimensional memory may also include a dielectric layer 700 covering the conductor layer 500. The contact hole 800 may penetrate through the dielectric layer 700 and the conductor layer 500, and extend to the gate layer farthest from the substrate 100. Both of the interlayer insulating layer 212 and the dielectric layer 700 may be insulating materials. Both of the materials of the gate layer 600 and the conductor layer 500 may include tungsten metal. The three-dimensional memory provided by the present disclosure can, on the basis of ensuring the uniformity of the gate layer, not only reduce the probability of breakdown of the gate layer, but also avoid the reduction of the thickness of a part of region in the gate layer.

In the exemplary implementation of the present disclosure, the three-dimensional memory may further include a dielectric layer for covering the buffer layer. For example, the three-dimensional memory may also include a dummy channel structure. The dummy channel structure can penetrate through the dielectric layer and the laminated structure and extend to the substrate.

The content and structure involved in the fabrication method 1000 described above may be fully or partially applicable to the three-dimensional memory described here. Therefore, the content related to or similar to it will not be repeated here.

Although an exemplary fabrication method and structure of a three-dimensional memory are described here, it is understood that one or more features may be omitted, replaced, or added from the structure of the three-dimensional memory. In addition, the respective illustrated layers and their materials are only exemplary.

The above description is only an explanation of some implementation of the present disclosure and the applied technical principles. Those skilled in the art should understand that the scope of the present disclosure is not limited to the technical solutions formed by the specific combination of the above technical features, but also covers other technical solutions formed by the arbitrary combination of the above technical features or their equivalent features without departing from the inventive concept, for example, the technical solutions formed by replacing the above features with (but not limited to) the technical features with similar functions disclosed in the present disclosure with each other.

What is claimed is:

1. A three-dimensional memory, comprising:
   a laminated structure including stacked gate layers and interlayer insulation layers, wherein a first gate layer of the gate layers and a first interlayer insulation layer of the interlayer insulation layers form a first staircase stair, the first gate layer being adjacent to the first interlayer insulation layer at a first side of the first interlayer insulation layer;
   a conductor layer on an end of the first interlayer insulation layer and, in a lateral direction, separated from a second gate layer of the gate layers through a portion of a dielectric layer, the second gate layer being adjacent to the first interlayer insulation layer at a second side of the first interlayer insulation layer; and
   a contact structure vertically penetrating through the dielectric layer, the conductor layer, and the first interlayer insulation layer in this order and extending into the first gate layer,
   wherein:
   the conductor layer and the second gate layer are aligned along a same vertical level; and
   a bottom of the portion of the dielectric layer, between the second gate layer and the conductor layer, is positioned below the vertical level.

2. The three-dimensional memory according to claim 1, further comprising:
   the dielectric layer covering sidewalls of the conductor layer.

3. The three-dimensional memory according to claim 2, wherein the first interlayer insulation layer and the dielectric layer comprise different insulating materials.

4. The three-dimensional memory according to claim 1, wherein materials of the first gate layer and the conductor layer both include tungsten.

5. The three-dimensional memory according to claim 1, wherein the first gate layer to which the contact structure extends is one of the gate layers that is closest to the conductor layer in a vertical direction perpendicular to the lateral direction.

6. The three-dimensional memory according to claim 1, wherein the contact structure penetrates through a portion of the first gate layer.

7. The three-dimensional memory according to claim 1, further comprising:
   the dielectric layer covering sidewalls and a top surface of the conductor layer.

8. The three-dimensional memory according to claim 1, wherein a material of the dielectric layer and a material of the first interlayer insulation layer are identical.

9. The three-dimensional memory according to claim 1, wherein the portion of the dielectric layer is configured to cover sidewalls of the first staircase stair.

10. The three-dimensional memory according to claim 1, wherein a material of the conductor layer and a material of the first gate layer are identical.

11. The three-dimensional memory according to claim 1, wherein the end of the first interlayer insulation layer is sandwiched between the conductor layer and the first gate layer.

12. The three-dimensional memory of claim 1, wherein an end of the conductor layer is flush with the end of the first interlayer insulation layer in a vertical direction perpendicular to the lateral direction.

13. The three-dimensional memory of claim 1, wherein the dielectric layer is a multi-layer structure.

14. The three-dimensional memory of claim 1, further comprising:
   the dielectric layer comprising a tetraethyl orthosilicate (TEOS) based silicon oxide layer.

15. The three-dimensional memory of claim 1, further comprises:
   the dielectric layer comprising a first sub-film layer and a second sub-film layer on the first sub-film layer, a density of the first sub-film layer being higher than a density of the second sub-film layer.

16. The three-dimensional memory of claim 1, wherein the contact structure comprises tungsten.

17. The three-dimensional memory of claim 1, wherein a portion of the first gate layer is configured to surround a first portion of the contact structure.

18. The three-dimensional memory of claim 1, wherein the conductor layer is configured to surround a second portion of the contact structure.

* * * * *